US008049337B2

(12) United States Patent
Chang et al.

(10) Patent No.: US 8,049,337 B2
(45) Date of Patent: Nov. 1, 2011

(54) SUBSTRATE AND MANUFACTURING METHOD OF PACKAGE STRUCTURE

(75) Inventors: Yun-Lung Chang, Kaohsiung (TW); Ming-Wei Sun, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 191 days.

(21) Appl. No.: 11/790,030

(22) Filed: Apr. 23, 2007

(65) Prior Publication Data
US 2008/0088028 A1   Apr. 17, 2008

(30) Foreign Application Priority Data
Oct. 17, 2006   (TW) ................................ 95138268 A

(51) Int. Cl.
*H01L 23/48* (2006.01)
(52) U.S. Cl. ........................................ 257/773; 438/107
(58) Field of Classification Search .......... 257/625–630, 257/773, 620, E21.524; 438/107
See application file for complete search history.

(56) References Cited

U.S. PATENT DOCUMENTS

| | | | |
|---|---|---|---|
| 6,291,260 B1 * | 9/2001 | Huang et al. .................. | 438/106 |
| 6,389,689 B2 * | 5/2002 | Heo ................................ | 29/840 |
| 7,091,583 B2 * | 8/2006 | Chen et al. .................... | 257/678 |
| 2006/0091533 A1 * | 5/2006 | Huang et al. .................. | 257/723 |

* cited by examiner

*Primary Examiner* — Steven Loke
*Assistant Examiner* — Kimberly M Thomas
(74) *Attorney, Agent, or Firm* — Muncy, Geissler, Olds & Lowe, PLLC

(57) ABSTRACT

A substrate board and a manufacturing method of a package structure are provided. The substrate board includes a first surface, a die-attaching area, a cutting area, a plurality of first pads and a first solder mask. The die-attaching area for attaching a die is located on the first surface. The first pads are disposed on the first surface. The first solder mask is partially disposed on the first surface to expose part of the cutting area and the first pads. The first solder mask is divided into a first inner area and a first outer area via the cutting area. The die-attaching area and the first pads are located in the first inner area. Wherein, part of the first mask is located on the cutting area for connecting the first inner area and the first outer area.

7 Claims, 11 Drawing Sheets

SUBSTRATE AND MANUFACTURING METHOD OF PACKAGE STRUCTURE

This application claims the benefit of Taiwan application Serial No. 095138268, filed Oct. 17, 2006, the subject matter of which is incorporated herein by reference.

BACKGROUND OF THE INVENTION

1. Field of the Invention

The invention relates in general to a substrate and a manufacturing method of a package structure, and more particularly to a substrate with a solder mask exposing part of a cutting area and a manufacturing method of a package structure.

2. Description of the Related Art

As technology develops, all kinds of new electronic products enabling people to handle things more easy. The electronic products perform digital calculation through chips with micro-electric circuits, for providing all kinds of electric functions. The chip is disposed on a substrate and electrically connected to the substrate through wire-bonding or flip-chip bonding. Inner circuits of the chip are electrically connected to an outer circuit through the substrate. Furthermore, the chip and the substrate are encapsulated by a sealant to form a package structure. The sealant can protect the chip form moisture or collision.

However, in the manufacturing process of the package structure, generally the substrate is a multiple substrate for increasing the manufacturing speed. Several chips are disposed on the multiple substrate. After the chips are packaged by a series of steps, the multiple substrate is cut to form several package structures. As a result, the manufacturing speed increases significantly.

Please refer to FIGS. 1A~1B at the same time. FIG. 1A illustrates a first surface 900a of a conventional substrate 900. FIG. 1B illustrates a second surface 900b of the conventional substrate 900. The substrate 900 includes the first surface 900a, the second surface 900b, a die-attaching area 980, a cutting area L900 and a groove 990. The die-attaching area 980 is located on the first surface 900a for attaching a die (not shown in FIGS. 1A~1B). The groove 990 penetrating the first surface 900a and the second surface 900b is formed on the cutting area L900. As shown in FIG. 1A and FIG. 1B, the cutting area L900 is a dotted rectangular loop. Four grooves 990 are formed on four sides of the cutting area L900. After the chips are packaged, four corners of the cutting area L900 are cut by using a cuter to form several rectangular package structures.

As shown in FIG. 1A, the substrate 900 further includes a first solder mask 910. The solder mask 910 covers the first surface 900a for protecting inner circuits of the substrate 900. The first solder mask 910 covers the entire first surface 900a and only exposes several first pads 930. The first pads 930 are for electrically connecting the chips. What is worth mentioning is that the first solder mask 910 totally covers the four corners of the cutting area L900.

As shown in FIG. 1B, the substrate 900 further includes a second solder mask 920. The second solder mask 920 cover the second surface 900b for protecting the inner circuits of the substrate 900. The second solder mask 920 covers the entire second surface 900b and exposes only several second pads 940. The second pads 940 are for electrically connecting to an outer circuit. What is worth mentioning is that the second solder mask 920 totally covers the four corners of the cutting area L900

However, the thermal expansion coefficients of the inner circuit, the first solder mask 910 and the second solder mask 920 do not match each other. As a result, the first solder mask 910 and the second solder mask 920 often crack. In general, the cracks often extend form the edges of the first solder mask 910 or the second solder mask 920 to central regions. When the cracks extend to the first solder mask 910 or the second solder mask 920 inside the cutting area L900, the strength of the package structure is affected seriously.

Furthermore, when the cutter cut the substrate 900 along the cutting area L900, the first solder mask 910 and the second solder mask 920 directly contact the cutter and are under the stress of the cutter. As a result, the first solder mask 910 or the second solder mask 920 peels off due to the stress.

As stated above, when the first solder mask 910 or the second solder mask 920 cracks or peels off, the package structure cannot protect the chip effectively. The yield rate of the package structure is significantly lowered, and the manufacturing cost is increased. Therefore, it is very important to resolve the above problems.

SUMMARY OF THE INVENTION

The invention is directed to a substrate and a manufacturing method of a package structure using the same. A first/second solder mask exposes part of a cutting area, and part of a first/second solder mask is located on the cutting area for connecting the first/second inner area and the first/second outer area. As a result, the substrate and the manufacturing method of the package structure using the same at least includes advantages such as preventing the cracks from extending, reducing the damage of stress, avoiding oxidizing of a first/second circuit structure and preventing the first/second circuit structure from deforming or peeling off.

According to the present invention, a substrate is provided. The substrate includes a first surface, a die-attaching area, a cutting area, several first pads and a first solder mask. The die-attaching area is located on the first surface for attaching a die. The first pads are disposed on the first surface. The first solder mask is partially disposed on the first surface to expose part of the cutting area and the first pads. The first solder mask is divided into a first inner area and a first outer area via the cutting area. The die-attaching area and the first pads are located in the first inner area. Part of the first solder mask is located on the cutting area for connecting the first inner area and the first outer area.

According to the present invention, a manufacturing method of a package structure is provided. The method includes at least following steps. First, a substrate is provided. The substrate includes a first surface, a die-attaching area and a cutting area. The die-attaching area is located on the first surface for attaching a die. Next, a first solder mask is formed on the first surface and exposes part of the cutting area and several first pads. The first solder mask is divided into a first inner area and a first outer area via the cutting area. The die-attaching area and the first pads are located in the first inner area. Part of the first solder mask is located on the cutting area for connecting the first inner area and the first outer area. Then, a die-attaching step is performed to attach a die in the die-attaching area. Afterwards, a cutting step is performed to cut the substrate along the cutting area for forming a package structure.

The invention will become apparent from the following detailed description of the preferred but non-limiting embodiments. The following description is made with reference to the accompanying drawings.

DETAILED DESCRIPTION OF THE INVENTION

First Embodiment

Figure 1A:
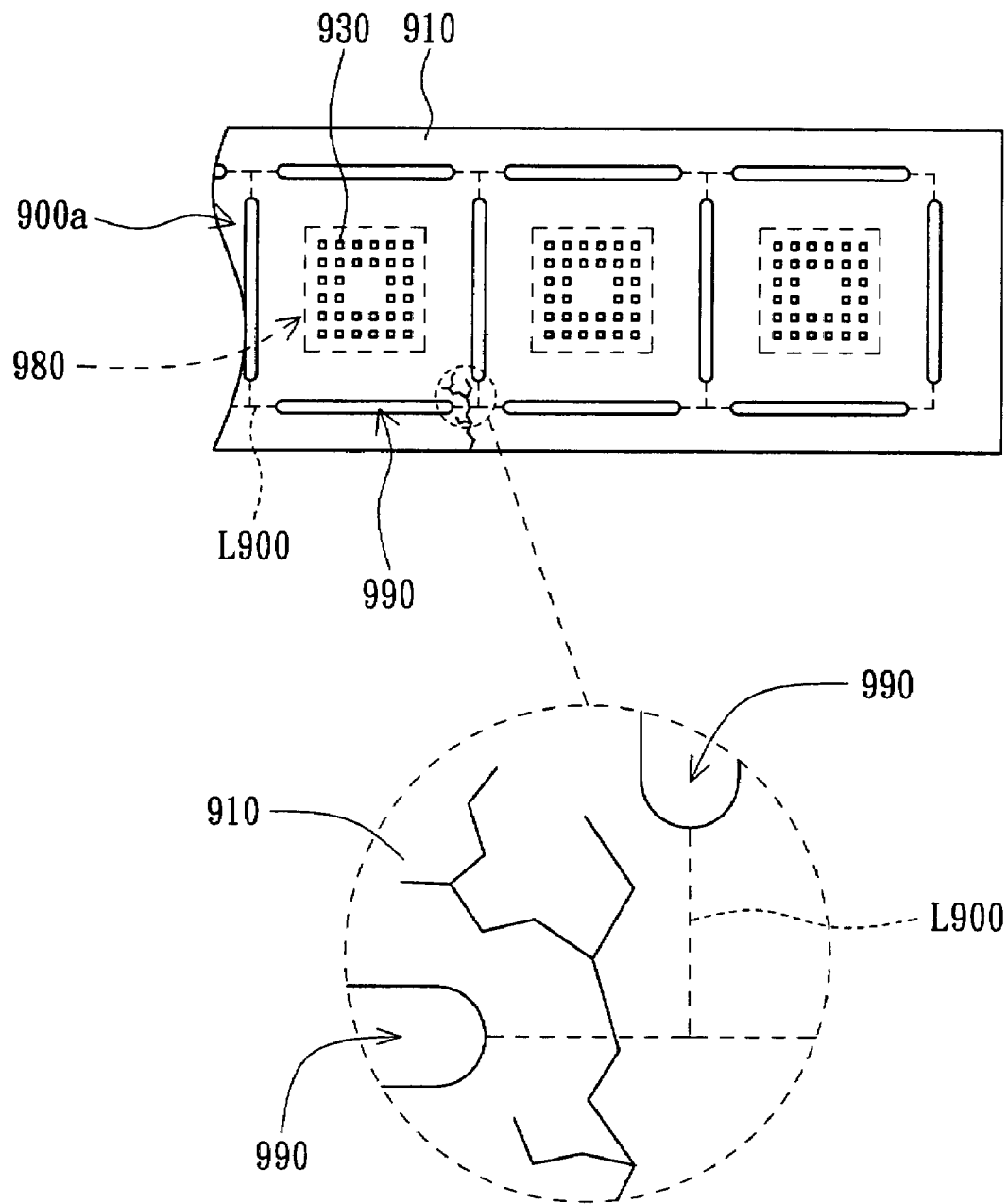
FIG. 1A (Prior Art) illustrates a first surface of a conventional substrate.
Figure 1B:
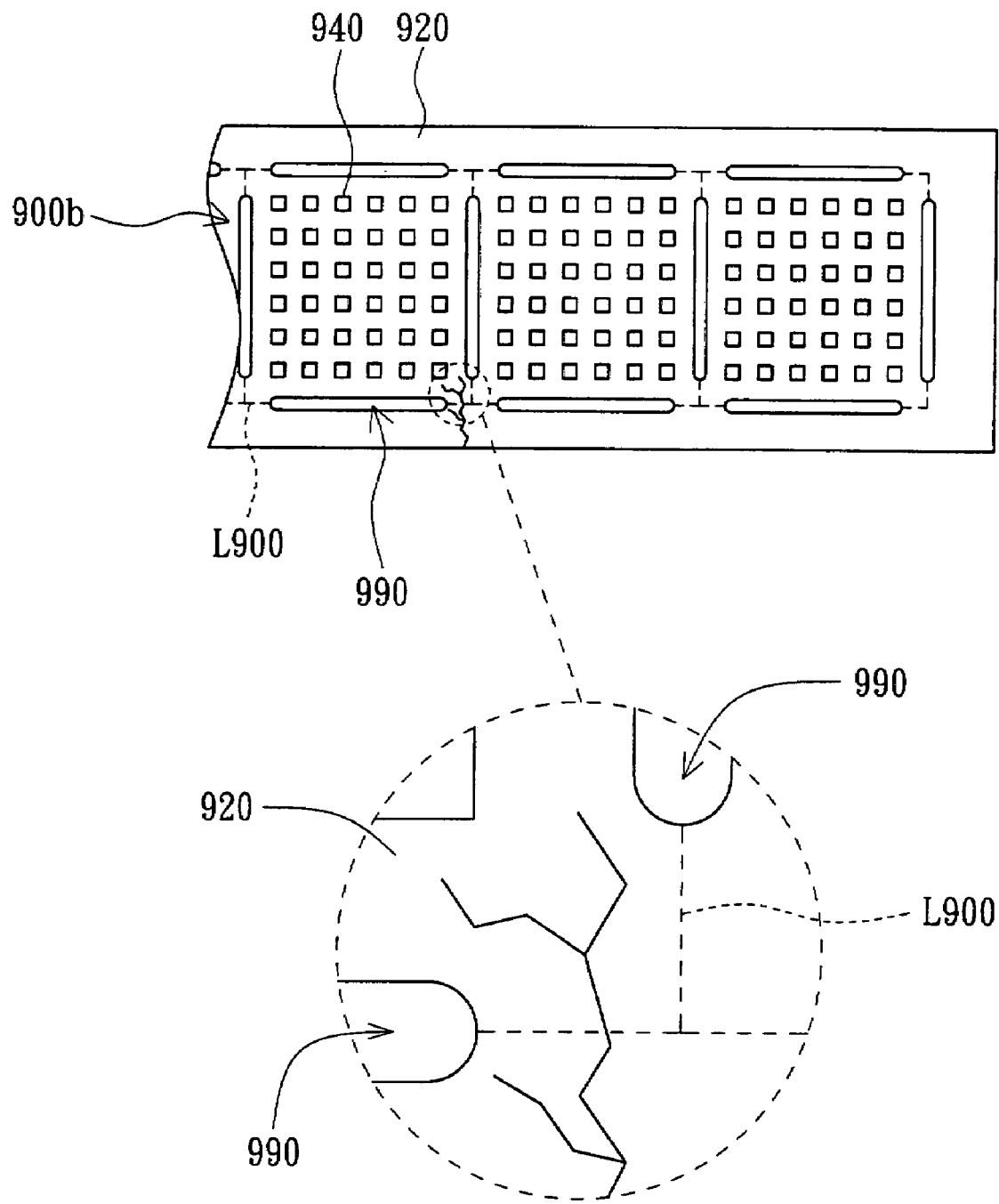
FIG. 1B (Prior Art) illustrates a second surface of the conventional substrate.
Figure 2A:
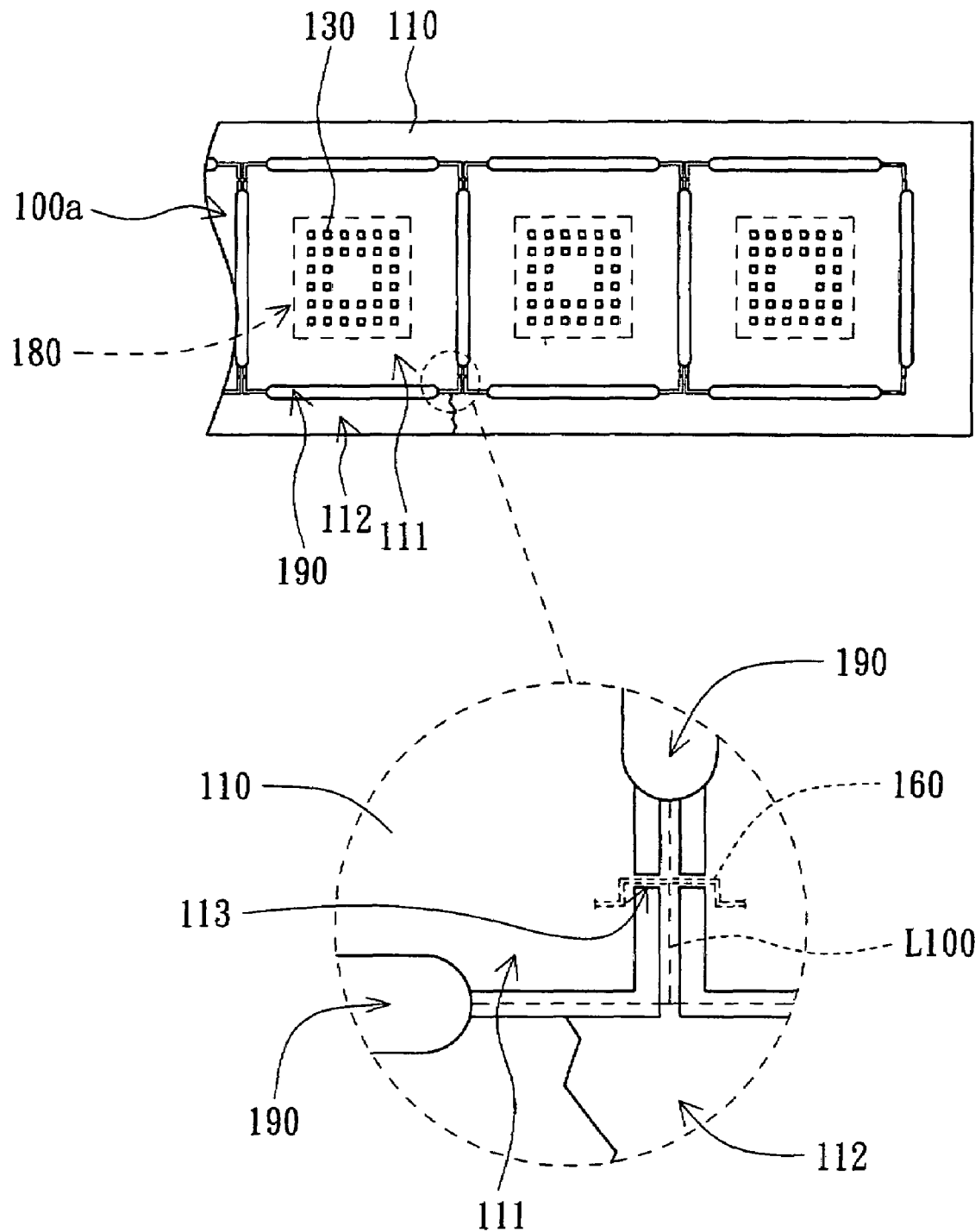
FIG. 2A illustrates a first surface of a substrate according to a first embodiment of the invention.

Please referring to FIG. 2A, a first surface 100a of a substrate 100 according to a first embodiment of the invention is illustrated in FIG. 2A. The substrate 100 includes the first surface 100a, a die-attaching area 180, a cutting area L100, several first pads 130 and a first solder mask 110. The die-attaching are 180 is for attaching a die (not shown in FIG. 2A). The first pads 130 are disposed on the first surface 100a. The first solder mask 110 is partially disposed on the first surface 100a and exposes part of the cutting area L100 and the first pads 130.

As shown in a dotted enlarge region in FIG. 2A, the first solder mask 110 is substantially divided into a first inner area 111 and a first outer area 112 via the cutting area L100. The die-attaching area 180 and the first pads 130 are located in the first inner area 111. Part of the first solder mask 110 is formed on the cutting area L100 for connecting the first inner area 111 and the first outer area 112.

When the edges of the substrate 100 crack, the cracks only extend from the edges to a bare area of the first solder mask 110 and not easily extend to the first inner area 111.

Furthermore, when a cutter cuts the substrate 100 along the cutting area L100, most of the first solder mask 110 does not contact the cutter directly. Only a little portion of the first solder mask 110 directly contacts the cutter. Therefore, the stress that the first solder mask 110 bears is reduced greatly. Through experiments, the stress that the first solder mask 110 bears is proved to be reduced to a certain level, such that the first solder mask 110 does not peel off due to the stress.

Moreover, the first solder mask 110 further includes a connecting area, such as a first strip area 113, connecting the first inner area 111 and the first outer area 112. The substrate 100 further includes a pre-die-attaching function line, such as a first circuit structure 160, passing through the cutting area L110. Generally, the first circuit structure 160 is an electroplated circuit or a test circuit. The first strip area 113 covers the first circuit structure 160 for preventing the first circuit structure 160 from oxidizing due to exposure to the air.

Moreover, because the first circuit structure 160 is an extremely thin (the thickness substantially less than 100 um), the circuit structure 160 is very fragile. When the first circuit structure 100 is pulled under stress, the first circuit structure 160 is easily deformed or peels off. Because the first strip area 113 covers the first circuit structure 160, the first circuit structure 160 does not contact the cutter directly. The damage of the stress is reduced.

Figure 2B:
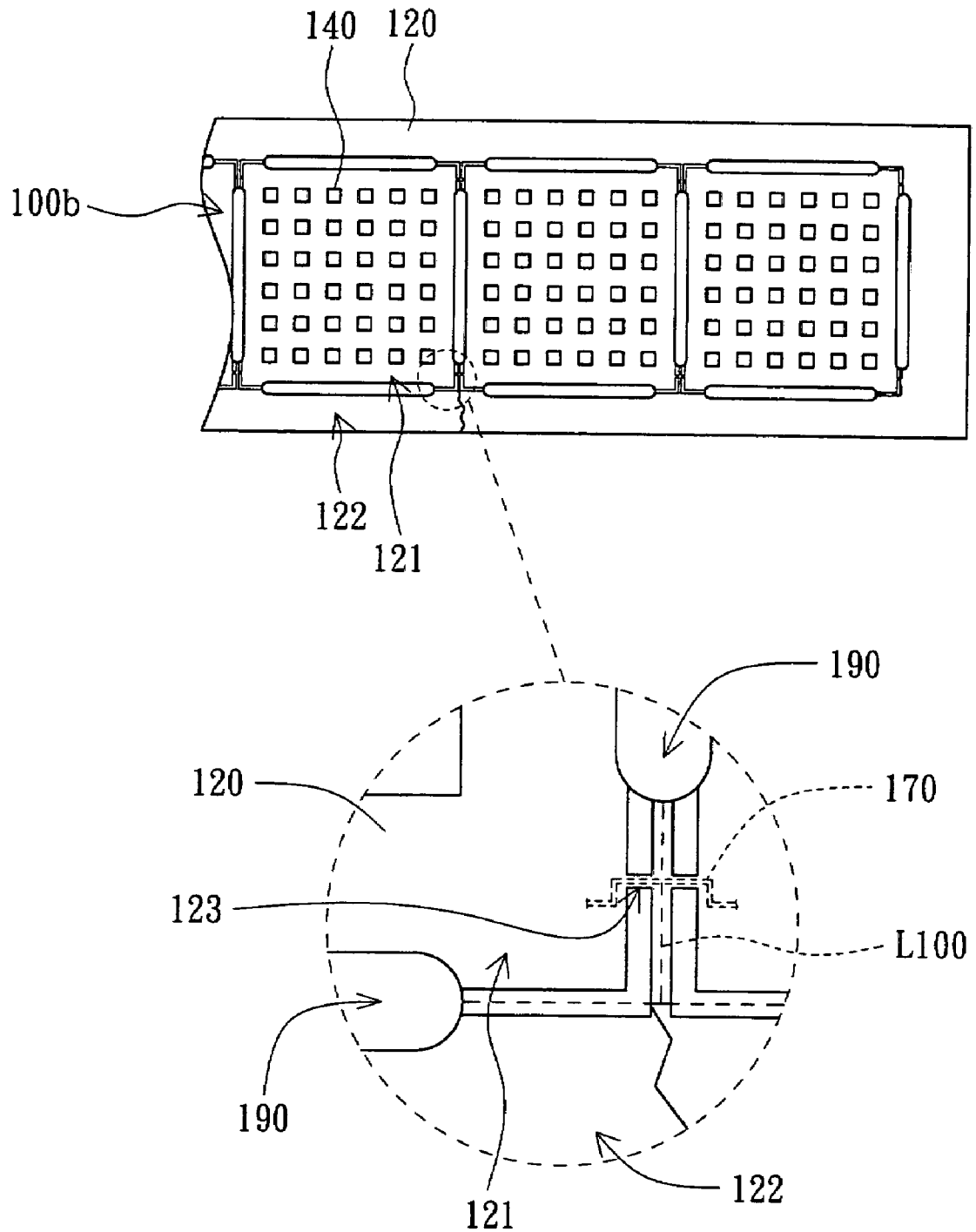
FIG. 2B illustrates a second surface of the substrate in FIG. 2A.

Please referring to FIG. 2B, a second surface 100b of the substrate 100 in FIG. 2A is illustrated in FIG. 2B. The substrate 100 further includes the second surface 100b, several second pads 140 and a second solder mask 120. Preferably, the second surface 100b of the substrate 100 has the same structure design of the first surface 100a. The second pads 140 are disposed on the second surface 100b. The second solder mask 120 is partially disposed on the second surface 100b and exposes part of the cutting area L100 and the second pads 140.

As shown in a dotted enlarged region in FIG. 2B, the second solder mask 120 is substantially divided into a second inner area 121 and a second outer area 122. The second pads 140 are corresponding to the second inner area 121. Part of the second solder mask 120 is located on the cutting area L100 for connecting the second inner area 121 and the second outer area 122.

Besides, the second solder mask 120 further includes at least a second strip area 123 connecting the second inner area 121 and the second outer area 122. The substrate 100 further includes a second circuit structure 170 passing through the cutting area L100. The second circuit structure 170 does not have to be disposed correspondingly to the first circuit structure 160. However, no matter where the second circuit structure 170 is disposed, the second strip area 123 is disposed correspondingly to the second circuit structure 170 and covers the second circuit structure 170.

Because the first surface 100a and the second surface 100b of the substrate 100 have the above structure designs, the first solder mask 110 or the second solder mask 120 does not crack or peel off easily. Furthermore, the first circuit structure 160 and the second circuit structure 170 are protected from oxidation, deformation or peeling.

A manufacturing method of a package structure 500 using the substrate 100 is illustrated as follow.

Figure 3:
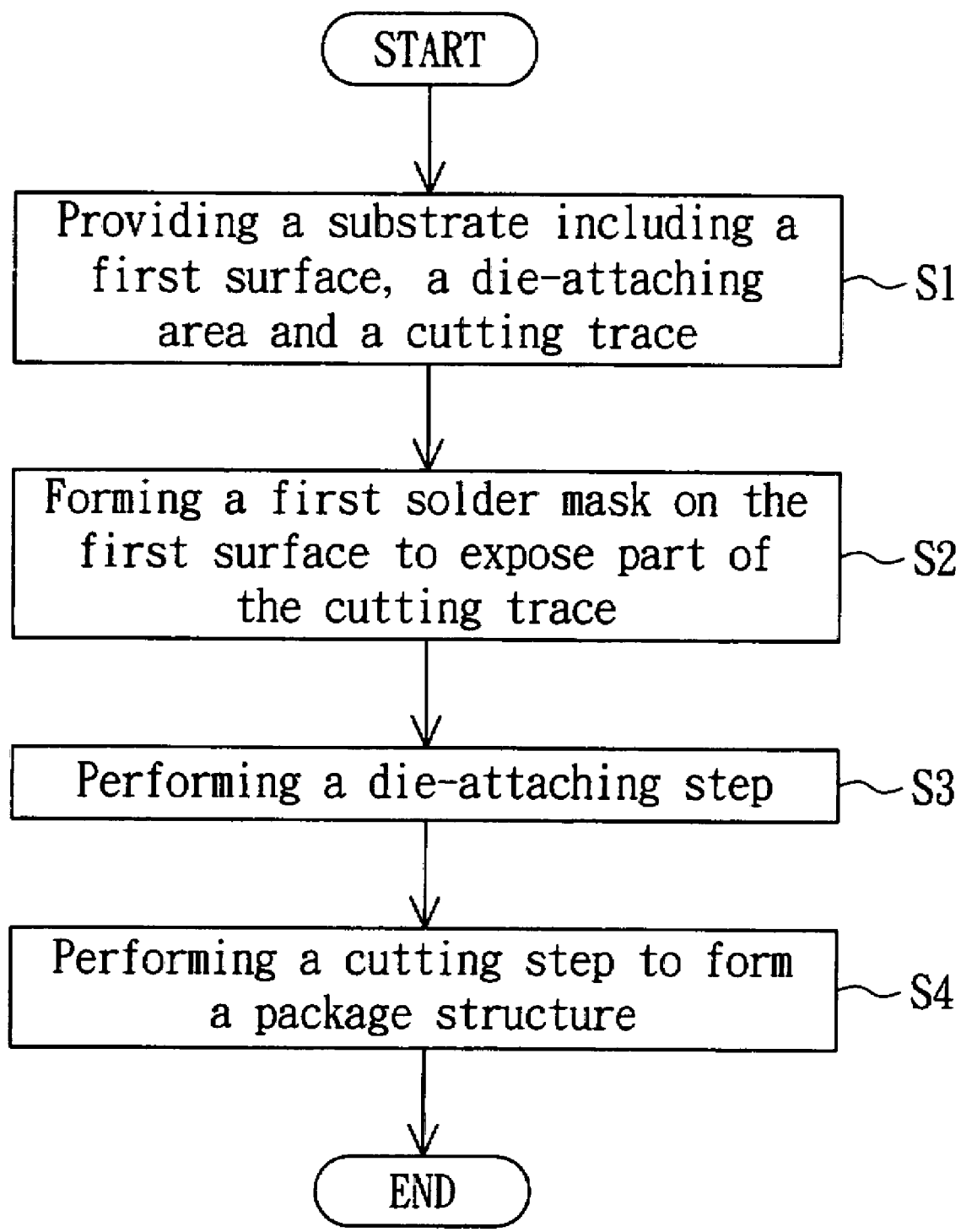
FIG. 3 is a flow chart of a manufacturing method of a package structure using the substrate according to the invention.
Figure 4A:
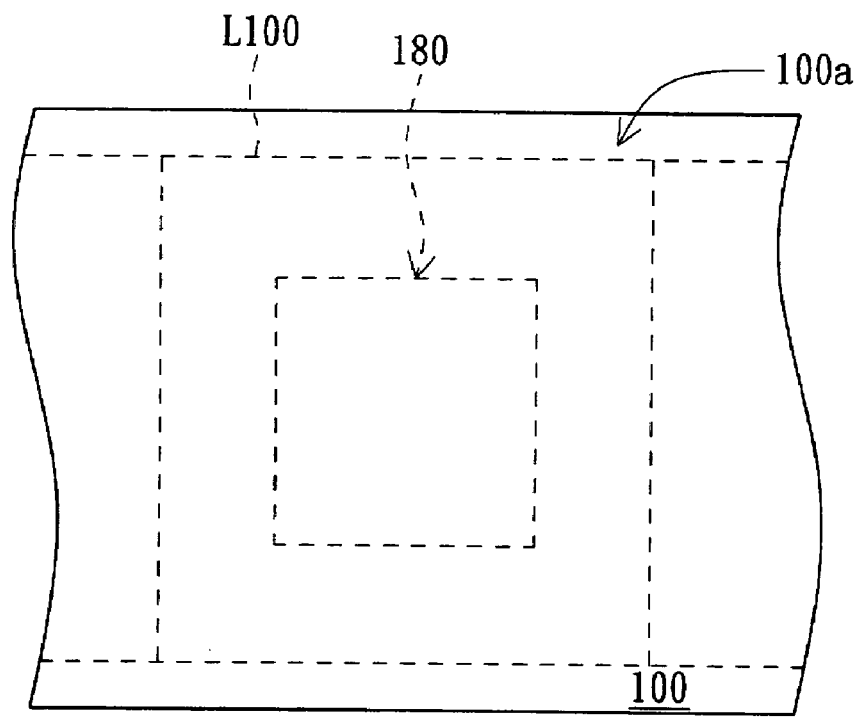
FIGS. 4A~4G illustrate steps of the manufacturing method in FIG. 3.
Figure 4B:
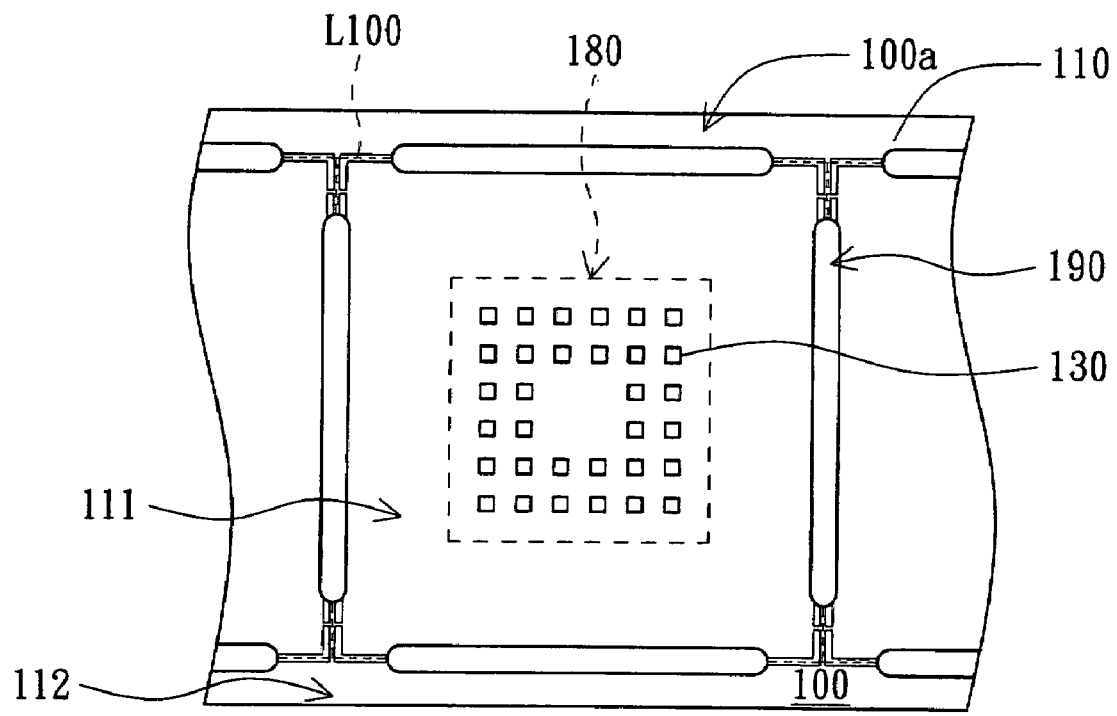
Figure 4C:
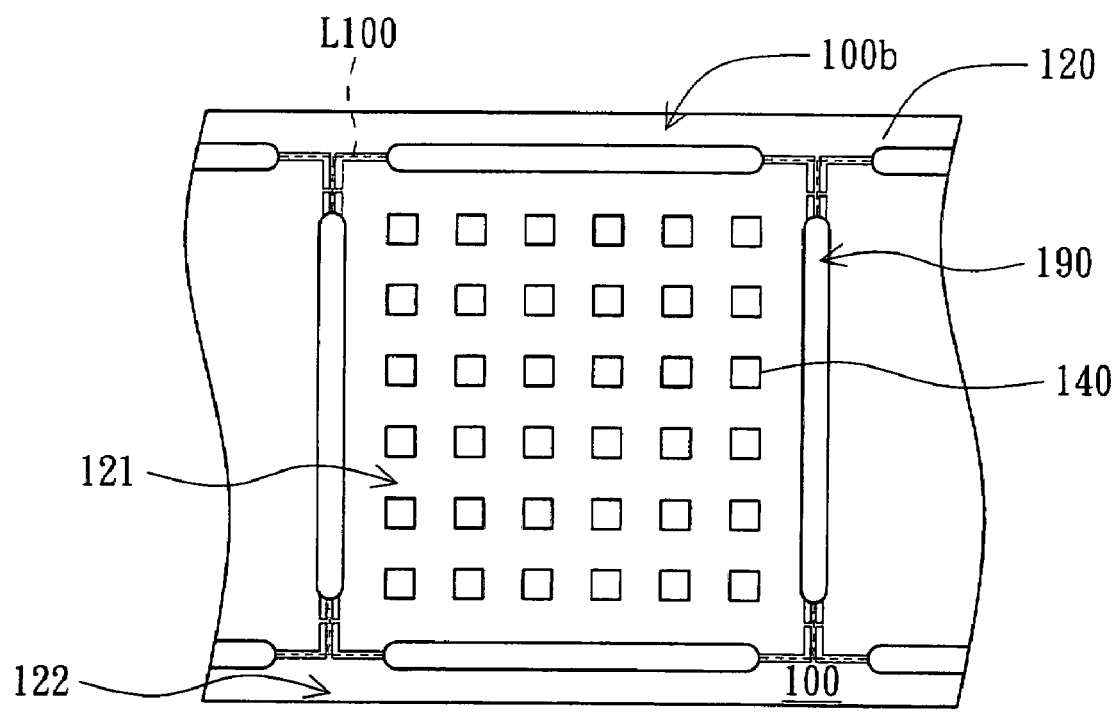
Figure 4D:
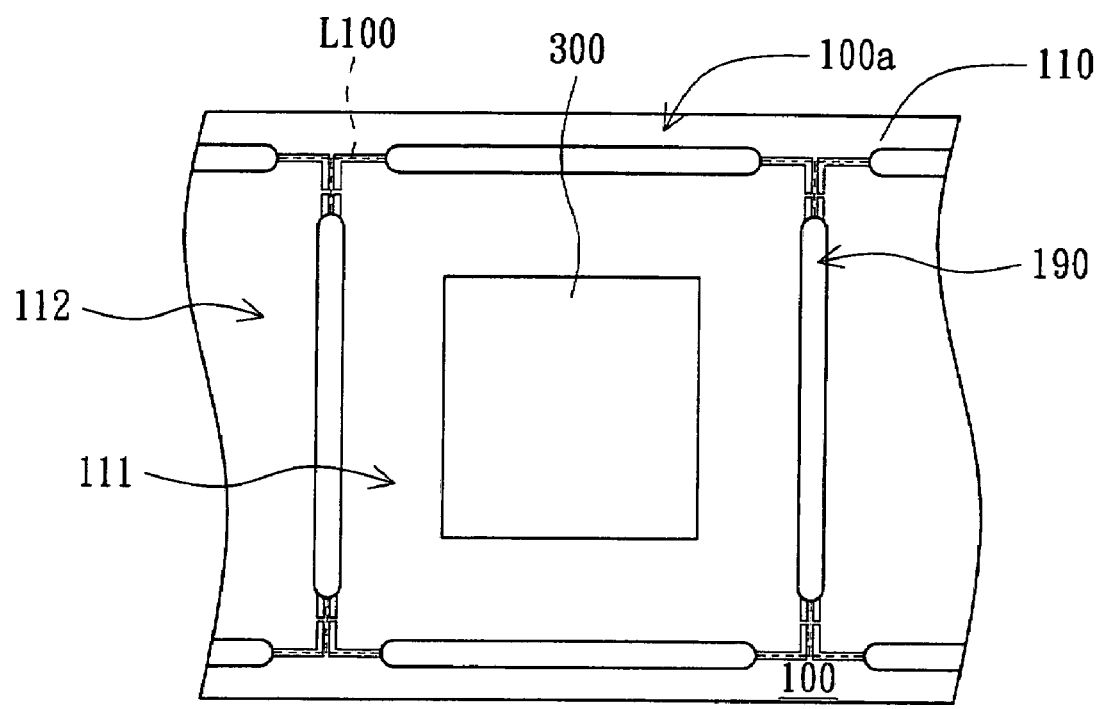

Please refer to FIG. 3 and FIGS. 4A~4G. FIG. 3 is a flow chart of the manufacturing method of the package structure 500 using the substrate 100 according to the invention. FIGS. 4A~4G illustrate steps of the manufacturing method in FIG. 3. First, in a step S1 in FIG. 3, the substrate 100 is provided, as shown in FIG. 4A. The substrate 100 includes the first surface 100a, the die-attaching area 180 and the cutting area L100. The die-attaching area 180 is located on the first surface 100a for attaching a die 300 (as shown in FIG. 4D).

Before the substrate 100 is separated, the substrate 100 is planned to be several package units. Each package unit is used for attaching one die 300 to form an independent package structure. Only one package structure is illustrated in FIG. 4B as an example.

Next, in a step S2 in FIG. 3, the first solder mask 110 is formed on the first surface 100a and exposes part of the cutting area L100 and several first pads 130 as shown in FIG. 4B. The first solder mask 110 is substantially divided into the first inner area 111 and the first outer area 112. The die-attaching area 180 and the first pads 130 are located in the first inner area 111. The first pads 130 are arranged in the die-attaching area 180 as an array. Part of the first solder mask 110 is located on the cutting area L100 for connecting the first inner area 111 and the first outer area 112.

Meanwhile, as shown in FIG. 4C, a second solder mask 120 exposing part of the cutting area L100 and several second pads 140 is formed on a second surface 100b. The second solder mask 120 is substantially divided into a second inner area 121 and a second outer area 122. The second pads 140 are located in the second inner area 121 and arranged in the second inner area 121 as an array. Part of the second solder mask 120 is located on the cutting area L100 for connecting the second inner area 121 and the second outer area 122.

As shown in FIGS. 4B~4C, in a step S2, at least a groove 190 is further formed on the cutting area L100. The groove 190 penetrates part of the first surface 100a and part of the second surface 100b. Four grooves 190 disposed on four sides of the cutting area L100 are narrow. Only four corners of the cutting area L100 support each package unit.

Then, in a step S3 in FIG. 3, a die-attaching step is performed as shown in FIG. 4D. The die 300 is attached in the die-attaching area 180. In the die-attaching step, the die 300 is electrically connected to the substrate 100 through flip-chip bonding.

In the present embodiment, the first pads 130 are arranged as an array in the die-attaching area 180 as an example, and the die 300 is electrically connected to substrate 100 through flip-chip bonding. However, the first pads 130 can be disposed around the die-attaching area 180, and the die 300 can be electrically connected to the substrate 100 through wire-bonding. The structure design of the present invention can be applied to all kinds of arrangement of the dies 300.

Figure 4E:
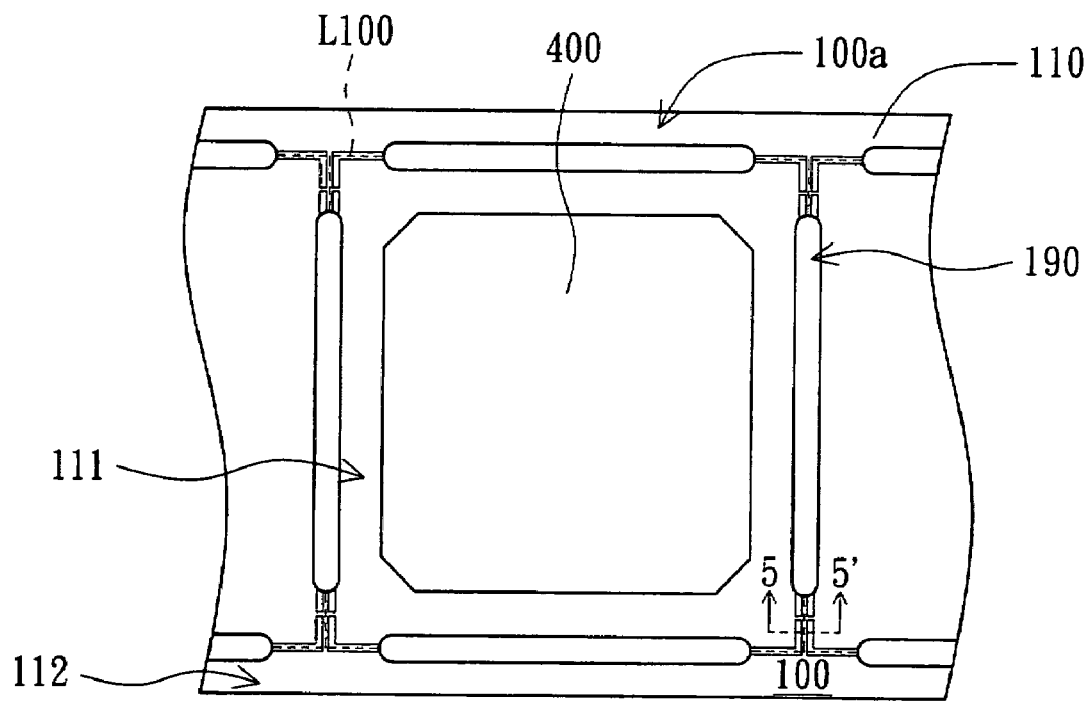

Then, as shown in FIG. 4E, a sealing step is performed to form a sealant 400 covering the die 300 and the die-attaching area 180.

Figure 4F:
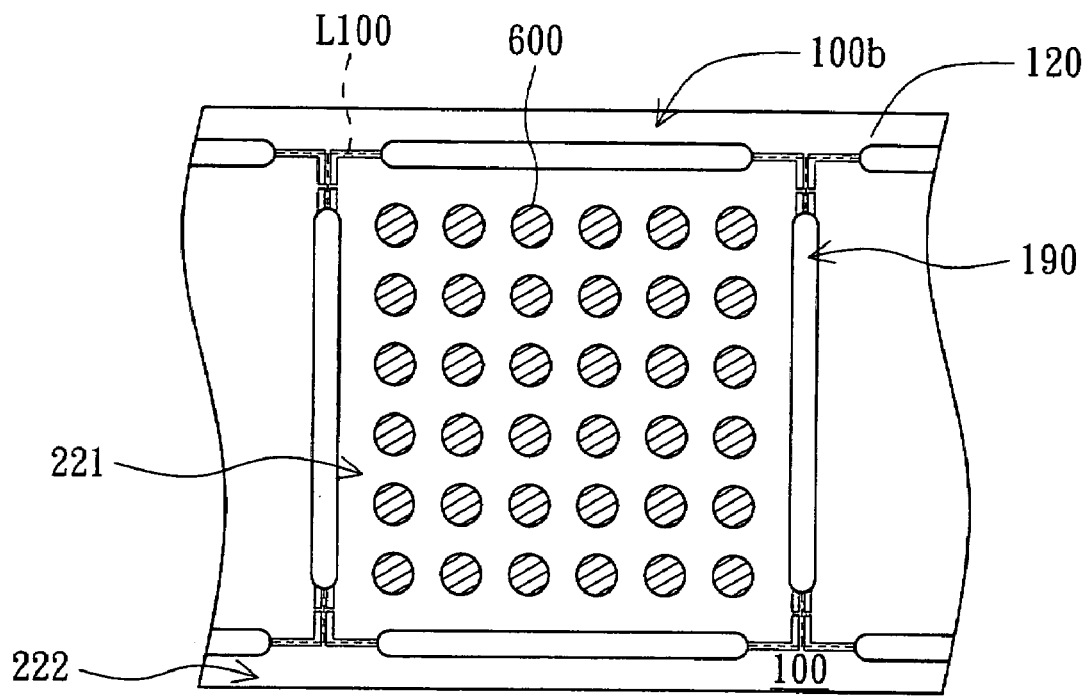

Afterwards, as shown in FIG. 4F, a ball planting step is performed to form several solder balls 600 on the second pads 140.

Figure 4G:
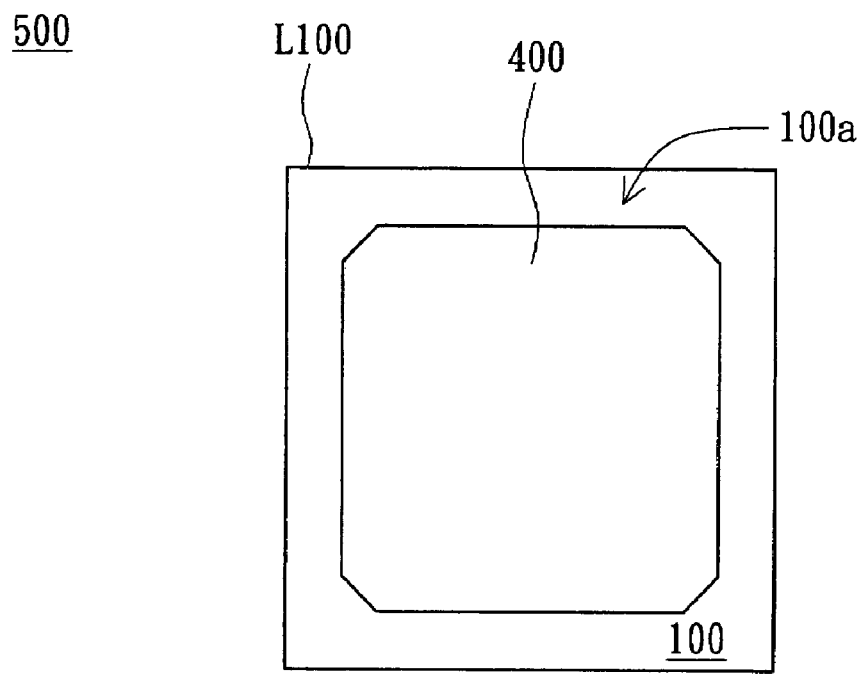
Figure 5:
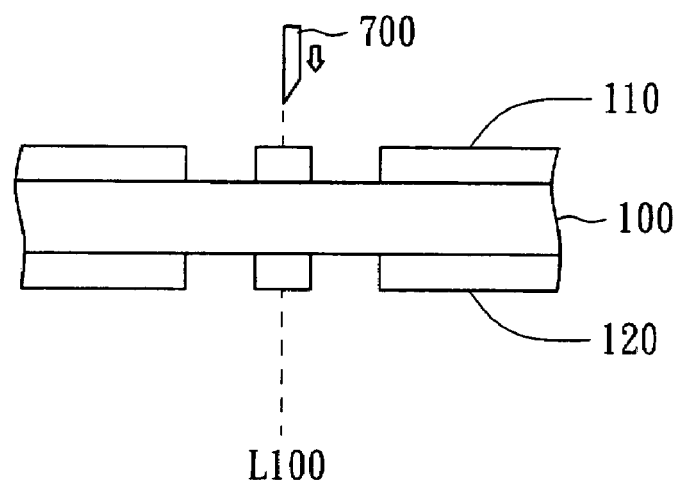
FIG. 5 illustrates the substrate in FIG. 4E along a cross-sectional line 5-5'.

Subsequently, a cutting step is performed in a step S4 in FIG. 3, as shown in FIG. 4G and FIG. 5. FIG. 5 illustrates the substrate 100 in FIG. 4E along a cross-sectional line 5-5'. In the present embodiment, the substrate 100 is cut by a punching method. The substrate 100 is cut by a cutter 700 along the cutting area L100 for forming a package structure 500. However, the cutting method is not limited thereto. The structure design of the invention can be adjusted according to different cutting methods. The stress still can be reduced through the structure design of the invention.

Second Embodiment

Figure 6A:
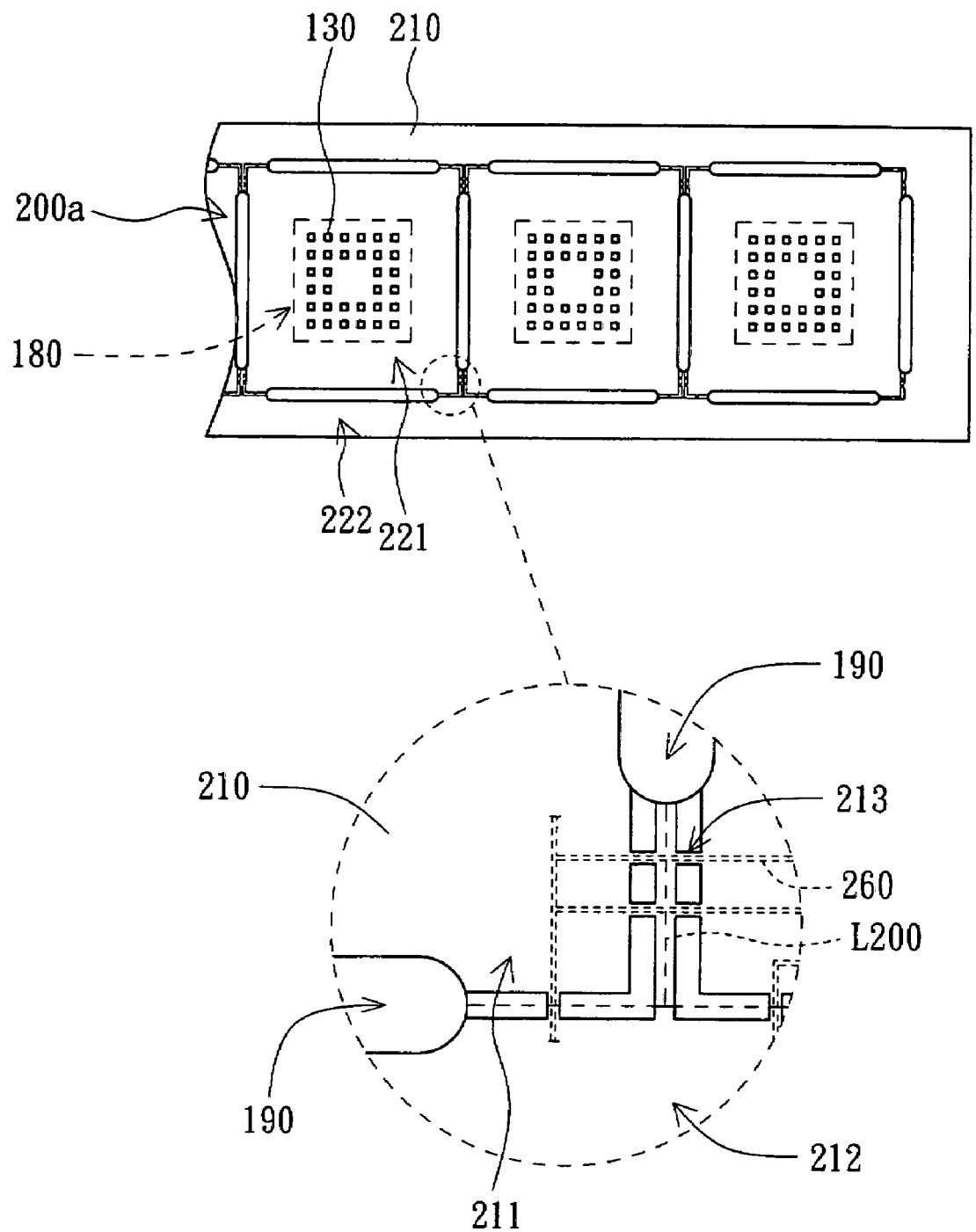
FIG. 6A illustrates a first surface of a substrate according to a second embodiment of the invention.
Figure 6B:
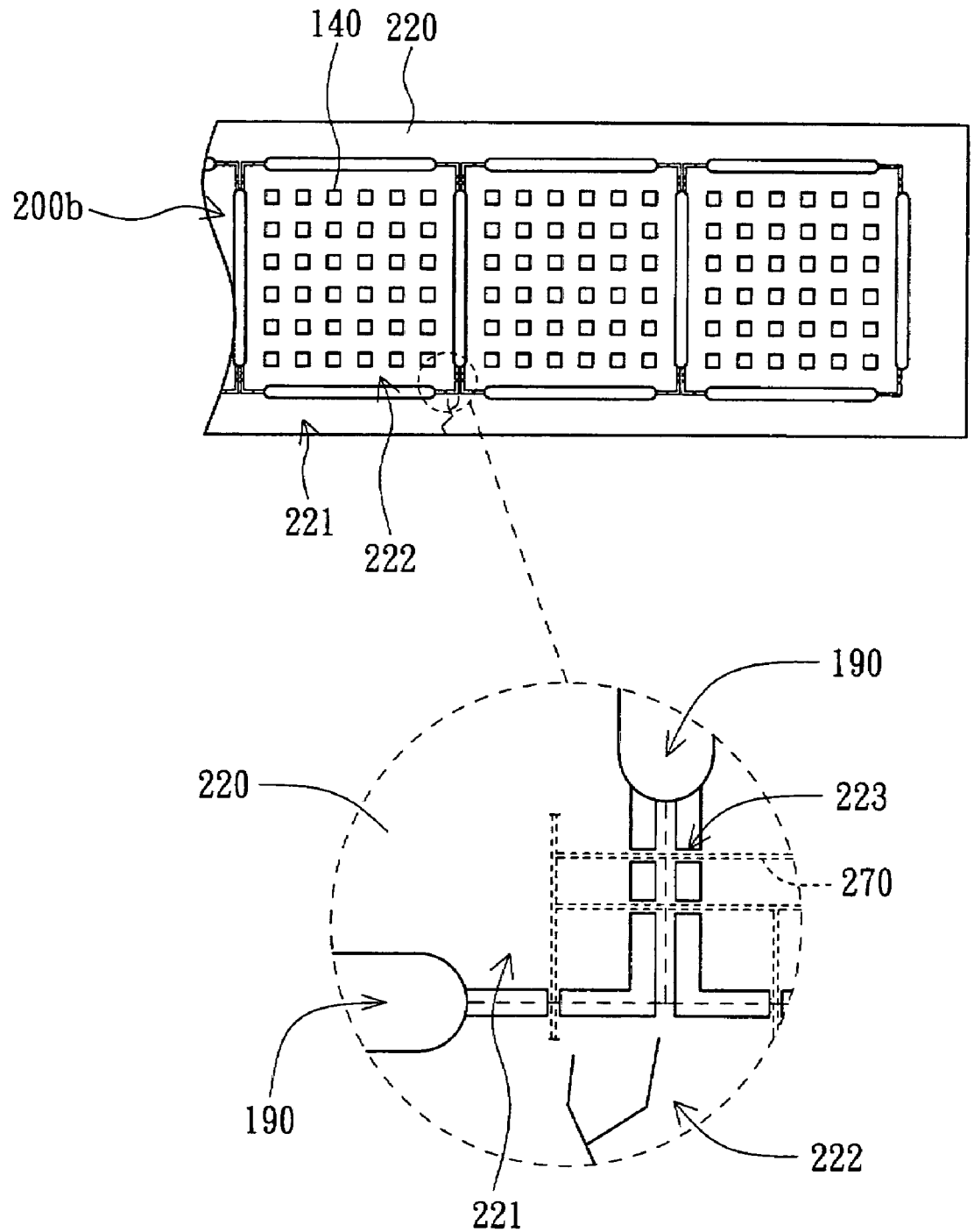
FIG. 6B illustrates the second surface of the substrate according to the second embodiment of the invention.

A substrate 200 of the present embodiment and the substrate 100 of the first embodiment are different in the number of the first strip areas 213 and the second strip areas 223. The same parts are not illustrated repeatedly. Please refer to FIGS. 6A-6B. FIG. 6A illustrates a first surface 200a of a substrate 200 according to the second embodiment of the invention. FIG. 6B illustrates a second surface 200b of the substrate 200 according to the second embodiment of the invention.

As shown in FIG. 6A, the first solder mask 210 includes several first strip areas 213. The first strip areas 213 are substantially perpendicular to the cutting area L200 and connect the first inner area 211 and the first outer area 212. The first strip areas 213 cover the first circuit structure 260 in the substrate 200 for protecting the first circuit structure 260 from oxidization, deformation or peeling off.

As shown in FIG. 6B, the second solder mask 220 includes several second strip areas 223. The strip areas 223 are substantially perpendicular to the cutting area L200 and connect the second inner area 221 and the second outer area 222. The second strip areas 223 cover the second circuit structure 270 in the substrate 200 for protecting the second circuit structure 270 from oxidation, deformation or peeling off.

Furthermore, the first strip areas 213 and the second strip areas 223 disposed perpendicular to the cutting area L200 are narrow. Therefore, the cracks occurring at the edges of the first solder mask 210 or the second solder mask 220 on the substrate 200 do not pass through the narrow first strip areas 213 and the second strip areas 223. The cracks do not extend to the first inner area 211 and the second inner area 221.

Besides, in the cutting step, the cutter only contacts the narrow first strip areas 213 and the second strip areas 223. Through experiments, the stress that the first solder mask 210 and the second solder mask 220 bear is proved to be relatively low, such that the first solder mask 210 and the second solder mask 220 do not peel off due to the stress.

Besides, in the cutting step, the cutter only contacts the narrow first strip solder masks 213 and the second strip areas 223. Through experiments, the stress that the first solder mask 210 and the second solder mask 220 bear is proved to be relatively low, such that the first solder mask 210 and the second solder mask 220 do not peel off due to the stress.

In the substrate and the manufacturing method of the package structure using the same according to the above embodiments of the invention, the first/second solder mask exposes part of the cutting area. Also, part of the first/second solder mask is located on the cutting area for connecting the first/second inner area and the first/second outer area. Therefore, the substrate and the manufacturing method of the package structure using the same at least include following advantages:

First, the cracks do not extend. The first/second solder mask is substantially divided into the first/second inner area and the first/second outer area via the cutting area. The cracks occurring at the edges of the first/second solder mask on the substrate do not extend to the central region and stop in the bare area of the first/second solder mask.

Second, the damage caused by stress is reduced. In the cutting step, the cutter only directly contacts the first/second strip area. Therefore, the stress that the first/second solder mask bears does not cause any damage.

Third, the first/second circuit structure is prevented from oxidation. The first/second strip area covers the first/second circuit structure to prevent the first/second circuit structure from exposing to the air. As a result, the first/second circuit structure is not oxidized.

Fourth, the first/second circuit structure is prevented from deformation or peeling off. The first/second circuit structure does not contact the cutter directly because the first/second strip area covers the first/second circuit structure. Therefore, the damage caused by pulling of stress is reduced.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A substrate, having a surface having a die-attaching area for attaching a die and an elongated cutting area spaced from the die-attaching area and extending along a cutting path and having an elongated exposing area therein extending along the cutting path, the cutting area having an inner side facing toward the die-attaching area, the substrate comprising:
    a plurality of pads disposed on the die-attaching area of the surface;
    a solder mask disposed on the surface, exposing the exposing area and the pads, the solder mask having:
        an inner area at the inner side of the cutting area; and
        an outer area separated from the inner area by the cutting area; and a first pre-die-attaching function line and a second pre-die-attaching function line crossing the cutting area from the inner area to the outer area, the mask further including a first connecting area and a second connecting area to cover the first pre-die-attaching function line and the second pre-die-attaching function line respectively so as to separate the exposing area into three exposing portions.

2. The substrate according to claim 1, wherein the surface is a first surface, the substrate further has a second surface, and the substrate further includes:

a groove penetrating part of the first surface and part of the second surface, the groove formed in part of the cutting area.

3. The substrate according to claim 2, wherein the groove is a narrow groove.

4. The substrate according to claim 1, wherein the pads are arranged in the die-attaching area in an array.

5. The substrate according to claim 1, wherein the pads are around the die-attaching area.

6. The substrate according to claim 1, wherein the first connecting area is smaller than the cutting area.

7. The substrate according to claim 1, wherein the shape of the edge of the first connecting area is a straight line.

* * * * *